United States Patent
Simms et al.

(10) Patent No.: US 12,360,174 B2
(45) Date of Patent: Jul. 15, 2025

(54) INVERTER DIAGNOSTIC TESTING METHODS AND APPARATUS

(71) Applicant: Eaton Intelligent Power Limited, Dublin (IE)

(72) Inventors: Stan Rex Simms, Arden, NC (US); Irving A. Gibbs, Mills River, NC (US); Gabriel Braga, Minas Gerais (BR); Thomas A. Farr, Candler, NC (US)

(73) Assignee: Eaton Intelligent Power Limited, Dublin (IE)

( * ) Notice: Subject to any disclaimer, the term of this patent is extended or adjusted under 35 U.S.C. 154(b) by 151 days.

(21) Appl. No.: 18/064,413

(22) Filed: Dec. 12, 2022

(65) Prior Publication Data

US 2024/0192284 A1 Jun. 13, 2024

(51) Int. Cl.
*G01R 31/42* (2006.01)
*H02M 7/487* (2007.01)

(52) U.S. Cl.
CPC .......... *G01R 31/42* (2013.01); *H02M 7/487* (2013.01)

(58) Field of Classification Search
CPC ........ G01R 31/42; G01R 19/18; H02M 7/487
USPC ....................................................... 324/120
See application file for complete search history.

(56) References Cited

U.S. PATENT DOCUMENTS

| | | |
|---|---|---|
| 10,093,351 B2 | 10/2018 | Kumagai et al. |
| 11,119,159 B2 | 9/2021 | He et al. |
| 2005/0281065 A1* | 12/2005 | Nojima ............... H02H 7/1227 363/98 |
| 2013/0148391 A1* | 6/2013 | Grbovic ............... H02M 7/487 363/56.01 |
| 2014/0218826 A1* | 8/2014 | Majarov ............... H02M 1/32 361/18 |
| 2015/0070047 A1 | 3/2015 | Yan et al. |
| 2018/0026550 A1* | 1/2018 | Dent ........................ H02J 7/35 363/55 |
| 2020/0044457 A1 | 2/2020 | Miyake et al. |
| 2020/0247464 A1 | 8/2020 | Koikegami et al. |

(Continued)

FOREIGN PATENT DOCUMENTS

| | | | |
|---|---|---|---|
| CN | 112858953 A | 5/2021 | |
| DE | 202020104644 U1 * | 1/2021 | ......... G01R 31/2621 |
| EP | 2728734 A1 * | 5/2014 | ............ H02M 7/487 |

(Continued)

OTHER PUBLICATIONS

Office Action dated Jan. 30, 2025 from related Chilean Patent Application No. 202303383, (and English Translation), 26 pages.

*Primary Examiner* — Tung X Nguyen
*Assistant Examiner* — Robert P Alejnikov, Jr.
(74) *Attorney, Agent, or Firm* — Stanek Lemon Crouse & Meeks PA

(57) ABSTRACT

Methods of testing a multilevel inverter include selectively pulsing (i.e., attempting to turn on) at least one of the inner and outer switches of the inverter and determining a status of at least one of the inner switches, the outer switches and the neutral clamping diodes of the inverter based whether the pulsed at least one of the inner and outer switches desaturates. The pulsing may be preceded by charging the DC bus to a predetermined voltage magnitude that is less than a nominal working voltage magnitude of the DC bus, e.g., the predetermined voltage magnitude may be around 50% or less of the nominal working voltage magnitude.

16 Claims, 13 Drawing Sheets

(56) References Cited

U.S. PATENT DOCUMENTS

2023/0120415 A1* 4/2023 Striegl ............... H02M 1/0043
363/131

FOREIGN PATENT DOCUMENTS

| EP | 2988408 A1 * | 2/2016 | ............ H02M 7/487 |
| EP | 3923432 A1 * | 12/2021 | ............. G01R 31/42 |
| WO | WO-2005109590 A1 * | 11/2005 | .............. H02M 1/32 |

* cited by examiner

INVERTER DIAGNOSTIC TESTING METHODS AND APPARATUS

BACKGROUND

The inventive subject matter relates to power conversion circuitry and, more particularly, to inverter circuitry used in apparatus such as motor drives.

Inverter circuits are used in a variety of different applications, such as solar and wind power grid-tie inverters, uninterruptible power supplies and motor drives (e.g., adjustable frequency drives). Such inverters may use high-current, high-voltage switching devices (e.g., transistors or thyristors) that can suffer failures that can result in the switching device becoming shorted or open-circuited. It is desirable to be able to determine the status of such switching devices before attempting normal operations, as these conditions may cause damage or create other risks when attempts are made to operate the apparatus.

SUMMARY

Some embodiments provide methods of testing a multi-level inverter including a plurality of poles coupled to a DC bus, each pole having inner and outer switches and a neutral clamping diode coupled thereto. The methods include selectively pulsing (i.e., attempting to turn on) at least one of the inner and outer switches and determining a status of at least one of the inner switches, the outer switch and the neutral clamping diodes based whether the pulsed at least one of the inner and outer switches desaturates. The pulsing may be preceded by charging the DC bus to a predetermined voltage magnitude that is less than a nominal working voltage magnitude of the DC bus, e.g., the predetermined voltage magnitude may be around 50% or less of the nominal working voltage magnitude. Charging of the DC bus may include connecting the DC bus to a DC power source to charge the DC bus and disconnecting the DC bus from the DC power source responsive to a magnitude of a voltage of the DC bus meeting or exceeding the predetermined voltage magnitude. The pulsing may occur after disconnecting the DC bus from the DC power source. The pulsing may be for a duration sufficient to allow desaturation of the pulsed switch without exceeding ratings of the switches and diodes of the inverter.

Further methods include selectively pulsing at least one the inner and outer switches and determining a status of at least one of the inner switches and the outer switches based whether a non-zero phase current occurs in response to the pulsing. The pulsing may be preceded by charging the DC bus to a predetermined voltage magnitude that is less than a nominal working voltage magnitude of the DC bus.

DETAILED DESCRIPTION

Figure 1:
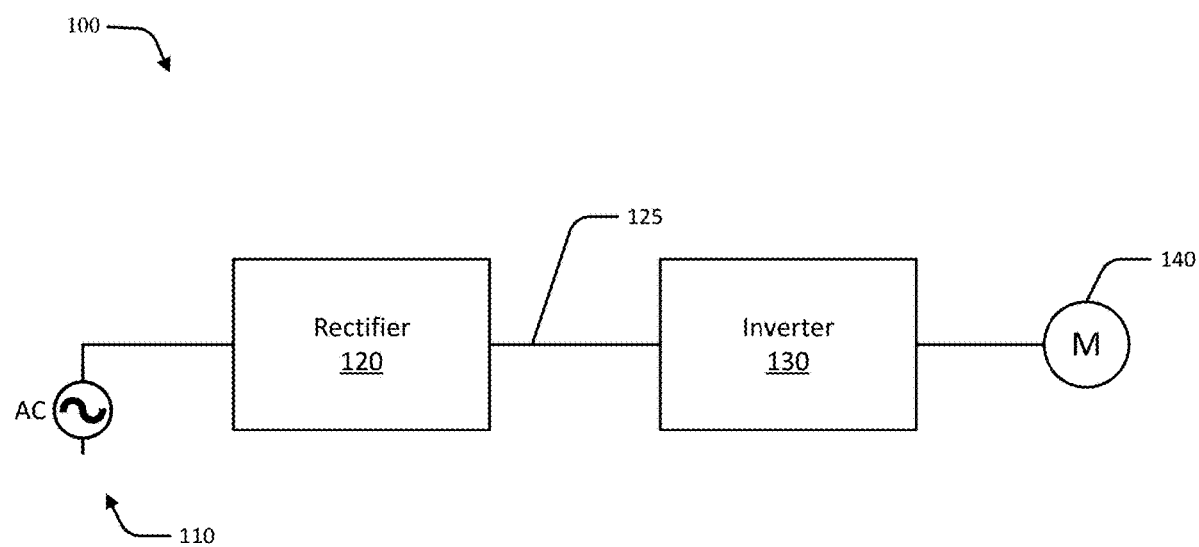
FIG. 1 is a schematic diagram of a motor drive in which embodiments of the inventive subject matter may be realized.

The inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

FIG. 1 illustrates a motor drive apparatus 100 in which some embodiments of the inventive subject matter may be implemented. The apparatus includes an input rectifier 120 configured to be coupled to an AC power source 110. Typically, the AC power source 110 is a three-phase utility feed and the rectifier 120 is a three-phase rectifier. The rectifier 120 is coupled to an inverter 130 by a DC bus 125, which typically includes a positive rail and a negative rail. The inverter 130 is configured to converter power received from the DC bus 125 to a three-phase output that is provided to a three-phase motor 140. The inverter 130 may have any of a variety of different architectures including, but not limited to, a two-level architecture, a three-level architecture, a five-level architecture, and the like. It will be further appreciated that some embodiments may be implemented in other inverter applications, such as applications in which an inverter is fed by a DC source other than a rectifier (as shown in FIG. 1), such as applications in which an inverter is connected to an energy storage device (e.g., a battery), a wind-powered generator or a solar photovoltaic array.

Figure 2:
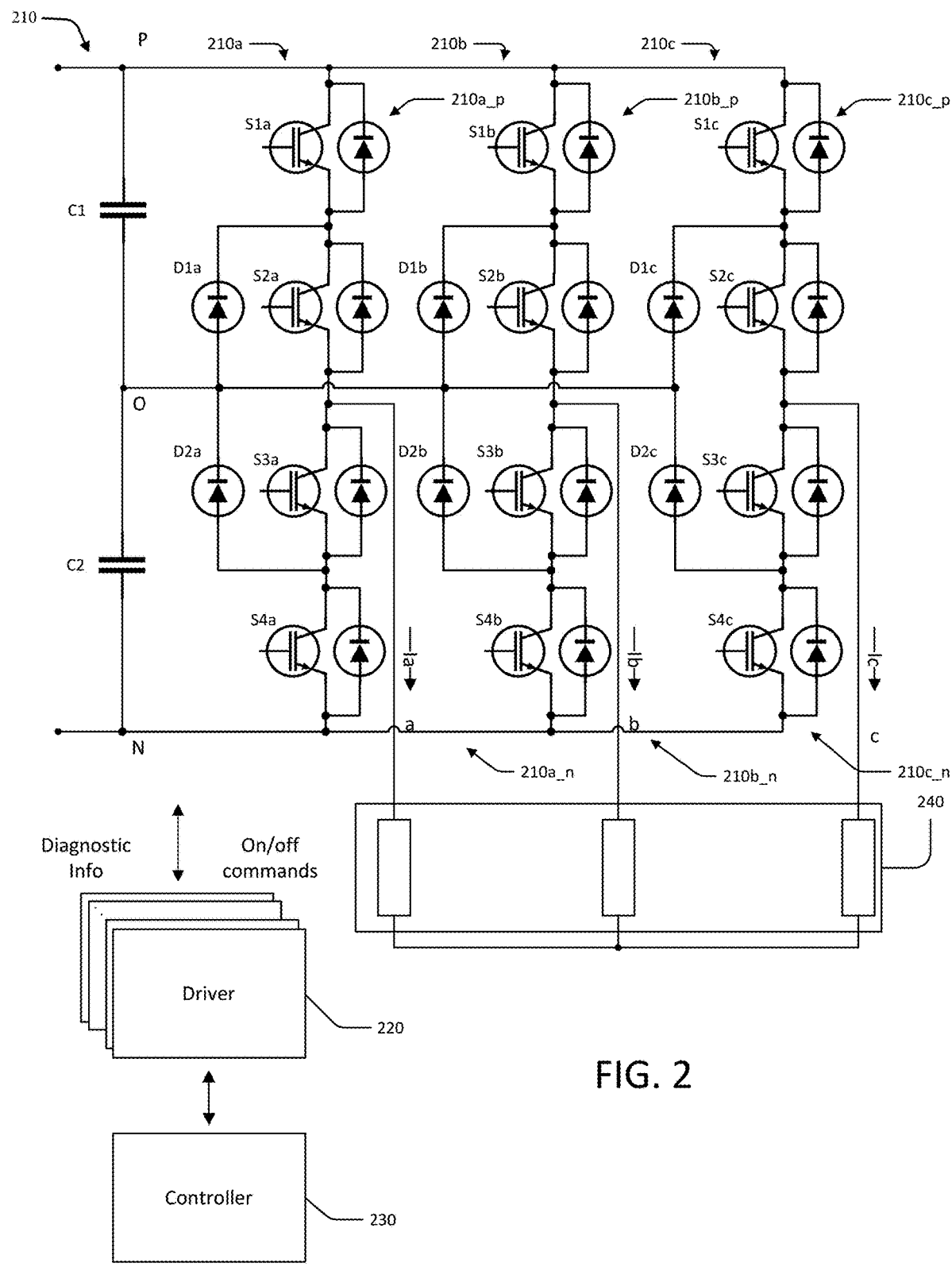
FIG. 2 is a schematic diagram illustrating an inverter and associated control circuitry for the motor drive of FIG. 1.

FIG. 2 illustrates an exemplary inverter architecture, including a three-phase, three-level neutral-point-clamping (NPC) switching circuit 210, which comprises three phase legs 210a, 210b, 210c connected between a positive DC bus P and a negative DC bus N and connected to respective phases a, b, c of a motor load 240. Each of the phase legs 210a, 210b, 210c has a positive pole 210a_p, 210b_p, 210c_p and a negative pole 210a_n, 210b_n, 210c_n. The positive poles 210a_p, 210b_p, 210c_p each include a positive pole outer transistor S1a, S1b, S1c and a positive pole inner transistor S2a, S2b, S2c. The negative poles 210a_n, 210b_n, 210c_n each include a negative pole inner transistor S3a, S3b, S3c and a negative pole outer transistor S4a, S4b, S4c. Neutral point clamping diodes D1a, D2a, D1b, D2b, D1c, D2c couple midpoints of the respective positive and negative poles 210a_p, 210b_p, 210c_p, 210a_n, 210b_n, 210c_n to a neutral O.

The transistors S1a, S2a, S3a, S4a, S1b, S2b, S3b, S4b, S1c, S2c, S3c, S4c are driven by respective driver circuits 220, which receive on/off drive commands from a controller circuit 230. As shown, the transistors S1a, S2a, S3a, S4a, S1b, S2b, S3b, S4b, S1c, S2c, S3c, S4c are insulated gate bipolar transistors (IGBTs) as are commonly used in 3-level neutral point clamped inverter circuits, but it will be appreciated that other types of semiconductor switches may be used, such as injection-enhanced gate transistors (IEGTs), insulated gate commutated thyristors (IGCTs), or symmetrical gate commutated thyristors (SGCTs). In some applications, the controller circuit 230 may be connected to the driver circuits 220 by respective fiber optic or other communications channels, which may convey off/on commands for the transistors S1a, S2a, S3a, S4a, S1b, S2b, S3b, S4b, S1c, S2c, S3c, S4c from the controller circuit 230 to the driver circuits 220. Communications channels between the driver circuits 220 and the controller circuit 230 may also convey diagnostic and other information from the driver circuits 220 to the controller circuits 220. Such diagnostic information may include, for example, signals acknowledging on/off commands received by the driver circuits 220 and information about various parameters of the transistors S1a, S2a, S3a, S4a, S1b, S2b, S3b, S4b, S1c, S2c, S3c, S4c, such as voltages and currents associated with the transistors S1a, S2a, S3a, S4a, S1b, S2b, S3b, S4b, S1c, S2c, S3c, S4c. For example, the driver circuits 220 may transmit information indicating whether the transistors S1a, S2a, S3a, S4a, S1b, S2b, S3b, S4b, S1c, S2c, S3c, S4c desaturate in response to on/off commands received from the controller circuit 230, which may used for short circuit testing along the lines discussed below. The controller circuit 230 may also receive information relating to phase currents Ia, Ib, Ic generated by the switching circuit 210.

FIGS. 3-13 illustrate various diagnostic operations that may be performed by the controller circuit 230 according to various embodiments. These operations may be used to determine the status of the transistors S1a, S2a, S3a, S4a, S1b, S2b, S3b, S4b, S1c, S2c, S3c, S4c and diodes D1a, D2a, D1b, D2b, D1c, D2c before normal operation of the switching circuit 210. In particular, these operations include selective pulsing of the transistors S1a, S2a, S3a, S4a, S1b, S2b, S3b, S4b, S1c, S2c, S3c, S4c so as to determine whether specific ones of the transistors S1a, S2a, S3a, S4a, S1b, S2b, S3b, S4b, S1c, S2c, S3c, S4c and diodes D1a, D2a, D1b, D2b, D1c, D2c are in a shorted or open-circuited condition that would prevent normal operation of the switching circuit 210. As referred to herein, "pulsing" refers to driving one or more of the transistors S1a, S2a, S3a, S4a, S1b, S2b, S3b, S4b, S1c, S2c, S3c, S4c in an attempt to turn the given transistor(s) on, irrespective of whether this attempt actually results in turning the given transistor(s) on. According to some aspects, these tests may be performed with the positive and negative DC buses P, N at less than nominal voltage levels, thus reducing voltages and currents applied to the tested devices and reducing or preventing damage to functional ones of the devices. The tests may be generally grouped into a first set of tests that determine device status based on whether a pulsed transistor desaturates and a second group of tests that determine device status based on whether phase currents are induced in load attached to the inverter in response to pulsing of selected transistors.

Figure 3:
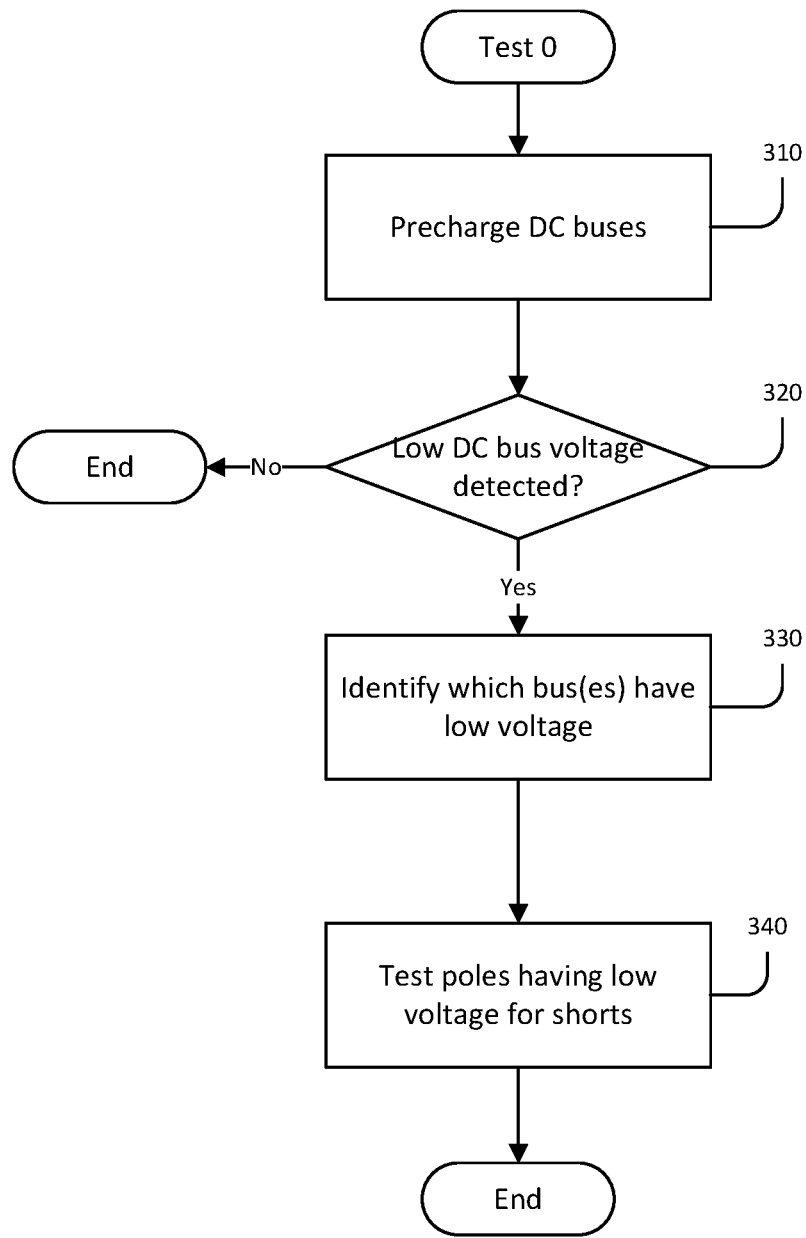
FIGS. 3-13 illustrate operations that may be implemented by the apparatus of FIGS. 1 and 2 according to various embodiments.

Referring to FIG. 3, in a first Test 0, the positive and negative DC buses P, N are charged (block 310). For example, the DC buses P, N may be charged by closing a charge contactor or other switch (not shown) to couple the DC buses to P, N to a DC power source, such as the rectifier 120 shown in FIG. 1. Capacitors C1 and C2 coupled to the buses P, N may receive the charging current and support voltages on the DC buses P, N. If a sufficient voltage magnitude can be maintained on either one or both of the buses P, N after a certain time (block 320), the test may terminate. If one or more of the bus voltages is low, however, the poles corresponding to the low voltage bus may be tested for shorts (blocks 320, 330, 340).

Figure 4:
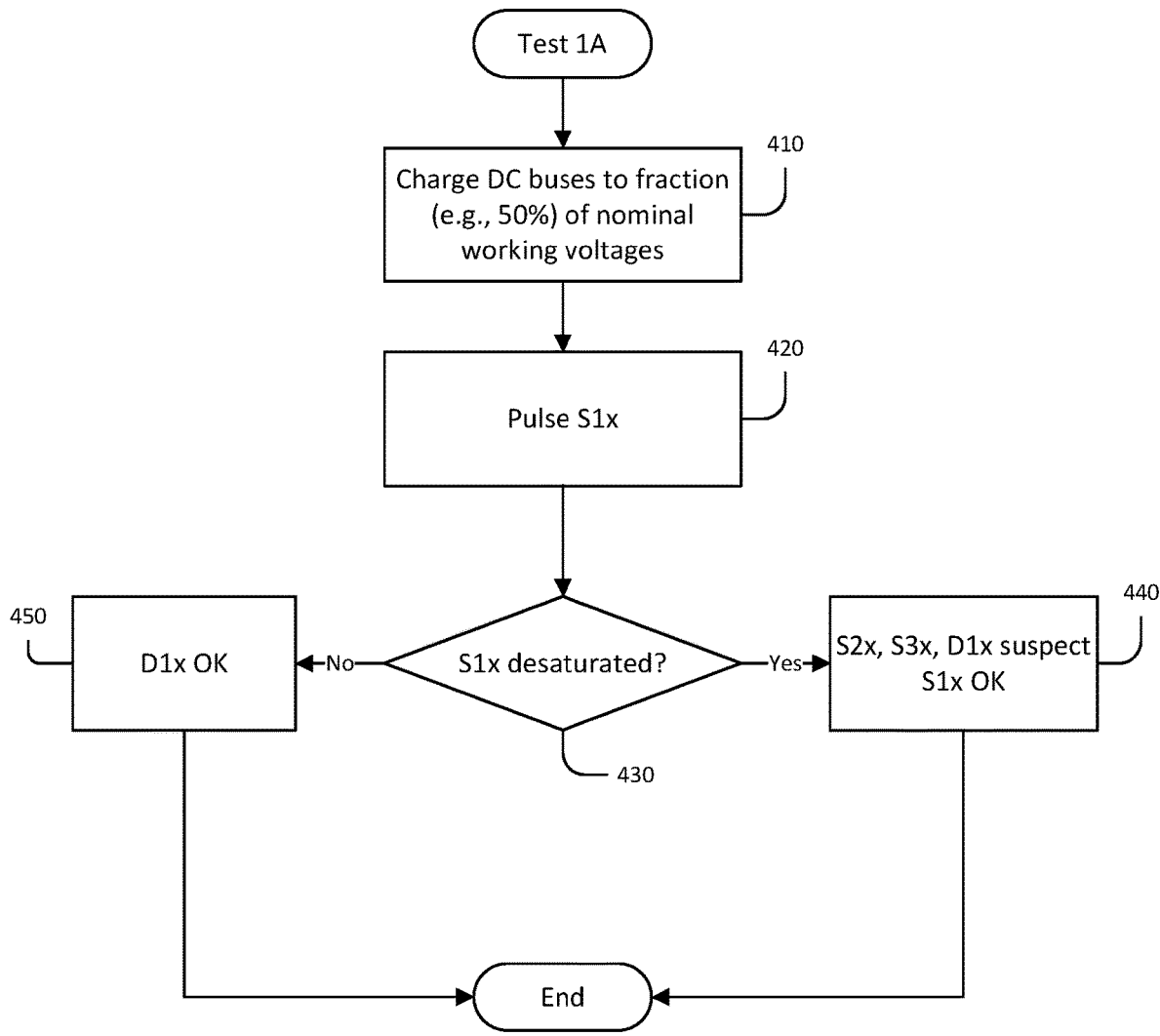

A first shorting Test 1A is shown in FIG. 4. The DC buses P, N are charged to a predetermined level (block 410). As discussed above, this charging may be performed by connecting the DC buses P, N to a DC power source and then disconnecting the DC buses P, N from the DC power source when predetermined voltage magnitude is reached. In some embodiments, this magnitude may be a fraction of the nominal operating voltage magnitudes of the DC buses P, N, e.g., around 50% of nominal. A pulse is applied to the positive pole outer transistor S1x of a given phase (block 420), wherein "x" indicates a given one of the phases a, b, c. The pulse may be sufficiently long enough to allow the positive pole outer transistor S1x to desaturate if a short is present but is preferably short enough to reduce or eliminate the possibility of damage if a short is present. For example, the pulse may be on the order of tens of microseconds (e.g., 30-40 microseconds), but it will be appreciated that an optimal pulse width may be dependent on the ratings of the transistors and/or other circuit parameters (e.g., inductance and capacitance) and the DC link amplitude that is used. If the transistor S1x becomes desaturated, the positive pole outer transistor S1x may be identified as functional and the corresponding positive pole inner transistor S2x, negative pole inner transistor S3x and corresponding positive pole diode D1x identified as suspect (blocks 430, 440). If the positive pole outer transistor S1x does not desaturate, then the corresponding positive pole diode D1x may be identified as functional (blocks 430, 450). This test is performed for each of the phases 210a, 210b, 210c.

Figure 5:
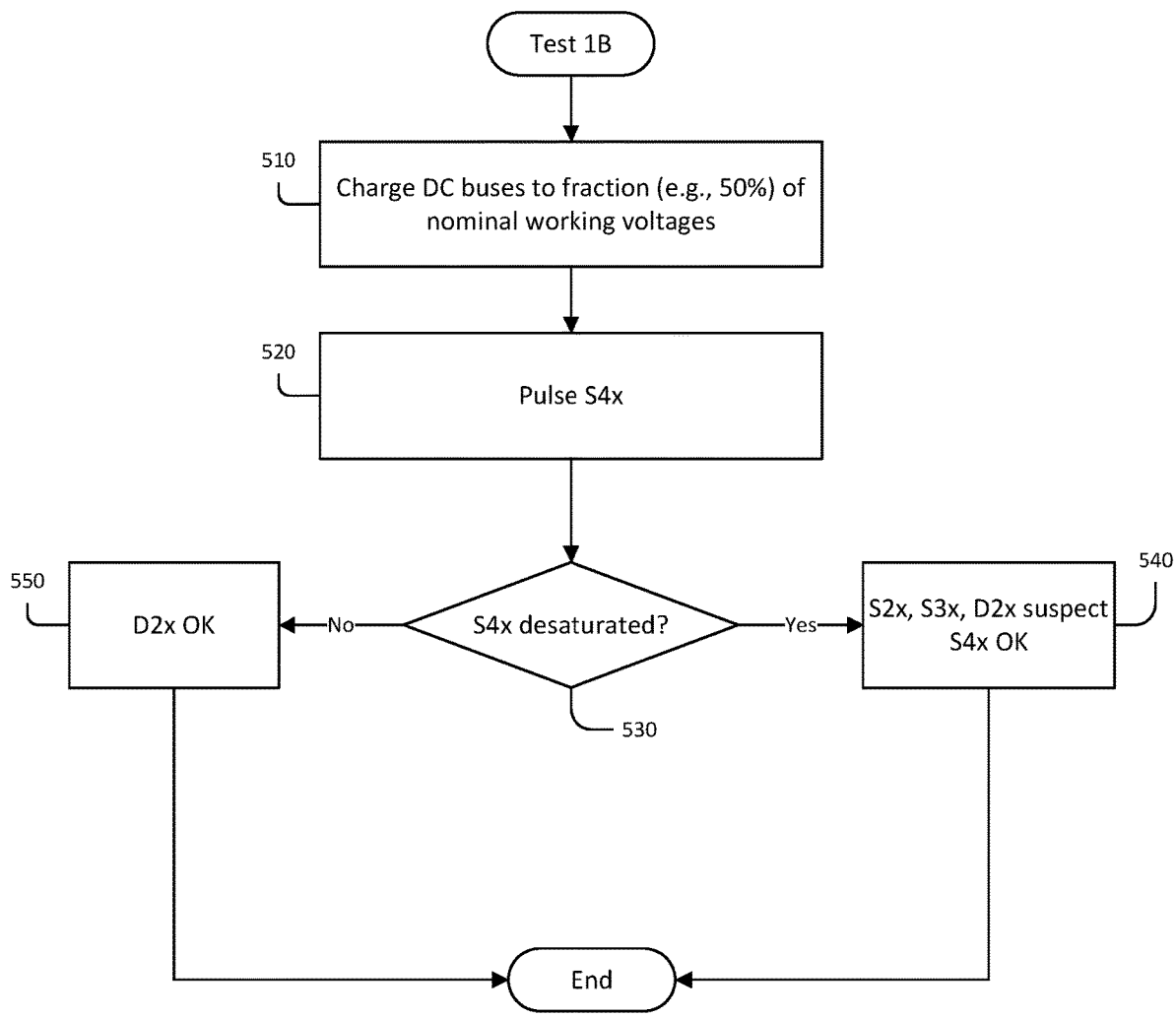

Referring to FIG. 5, after Test 1A is completed for each of the phases, a complementary shorting Test 1B may be performed. The DC buses P, N are charged to the desired magnitudes (block 510), followed by applying a pulse to the negative pole outer transistor S4x (block 520). This pulse may be similar in duration to that described above with reference to FIG. 4. If the negative pole outer transistor S4x desaturates, this indicates that the negative pole outer transistor S4x is functional and that the corresponding positive pole inner transistor S2x, the negative pole inner transistor S3x and the negative pole diode D2x are suspect (blocks 530, 540). If not, the negative pole diode D2x may be identified as functional (blocks 530, 550). This test is performed for each of the phases 210a, 210b, 210c.

Figure 6:
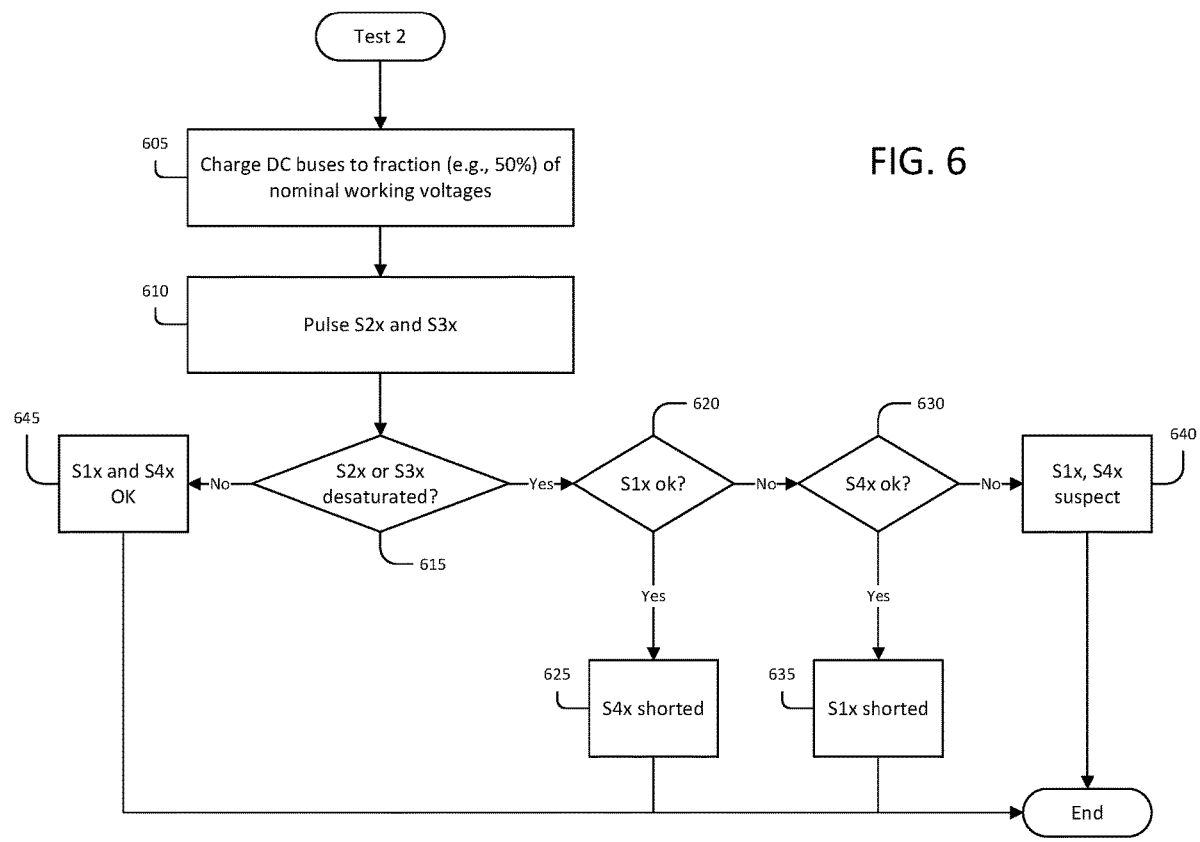

A next shorting Test 2 is shown in FIG. 6. Again, the DC buses are charged to a fraction of the nominal working voltages (block 605). The positive and negative pole inner transistors S2x, S3x of a phase are pulsed (block 610). The pulse duration may be similar to that described above with reference to FIG. 4. If either of the positive and negative pole inner transistors S2x, S3x desaturates and the corresponding positive pole outer transistor S1x has been previously identified as functional (see Test 1A, FIG. 4), then the negative pole outer transistor S4x may be identified as shorted (blocks 615, 620, 625). If the positive pole outer transistor S1x has yet to be identified as functional and the negative pole outer transistor S4x has been previously identified as functional, then the positive pole outer transistor S1x may be identified as shorted (blocks 630, 635). If neither of the outer transistors S1x, S4x have been previously identified as functional, then both of the outer transistors S1x, S4x may be identified as suspect (blocks 620, 630, 640). The same test is performed for each of the phases 210a, 210b, 210c.

Figure 7:
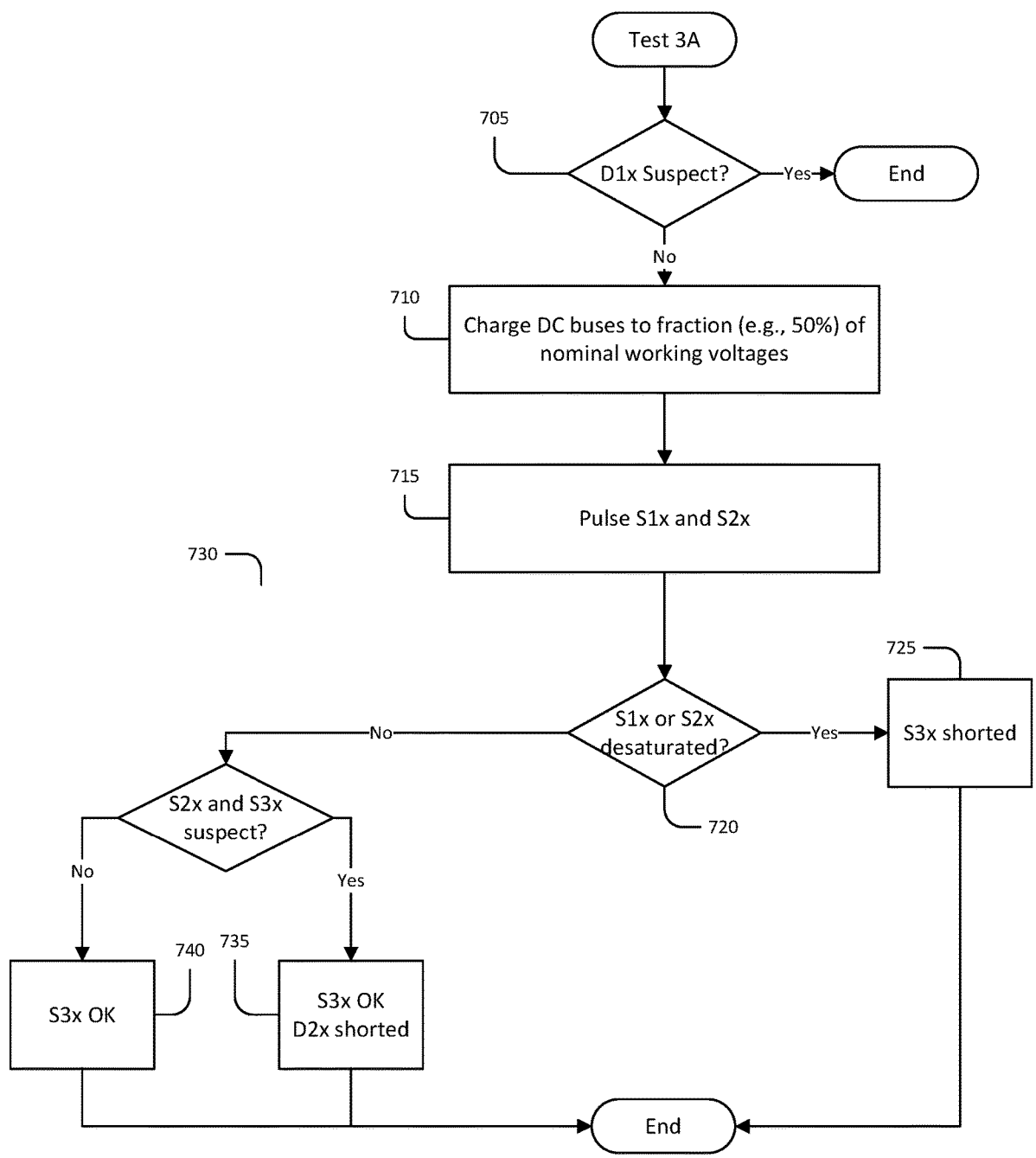

FIG. 7 illustrates a subsequent desaturation-based shorting Test 3A. If the positive pole diode D1x of a phase has been previously identified as suspect, this test is not performed (block 705). If the positive pole diode D1x has not been previously identified as suspect, the bus is again charged to the appropriate magnitude and the positive pole outer and inner transistors S1x, S2x are pulsed (blocks 710, 715). The pulse length may be as described above with reference to FIG. 4. If either of the positive pole outer and inner transistors Six, S2x desaturates, then the negative pole inner transistor S3x may be identified as shorted and the test terminated (blocks 720, 725). If neither of the positive pole outer and inner transistors S1x, S2x desaturates, and both of the positive and negative pole inner transistors S2x, S3x are suspect, then the negative pole inner transistor S3x may be identified as functional and the corresponding negative pole diode D2x identified as shorted (blocks 720, 730, 735). If neither of the inner transistors S2x, S3x has been previously identified as suspect, then the negative pole inner transistor S3x may be identified as functional (blocks 730, 740). This test is performed for each of the phases 210a, 210b, 210c.

Figure 8:
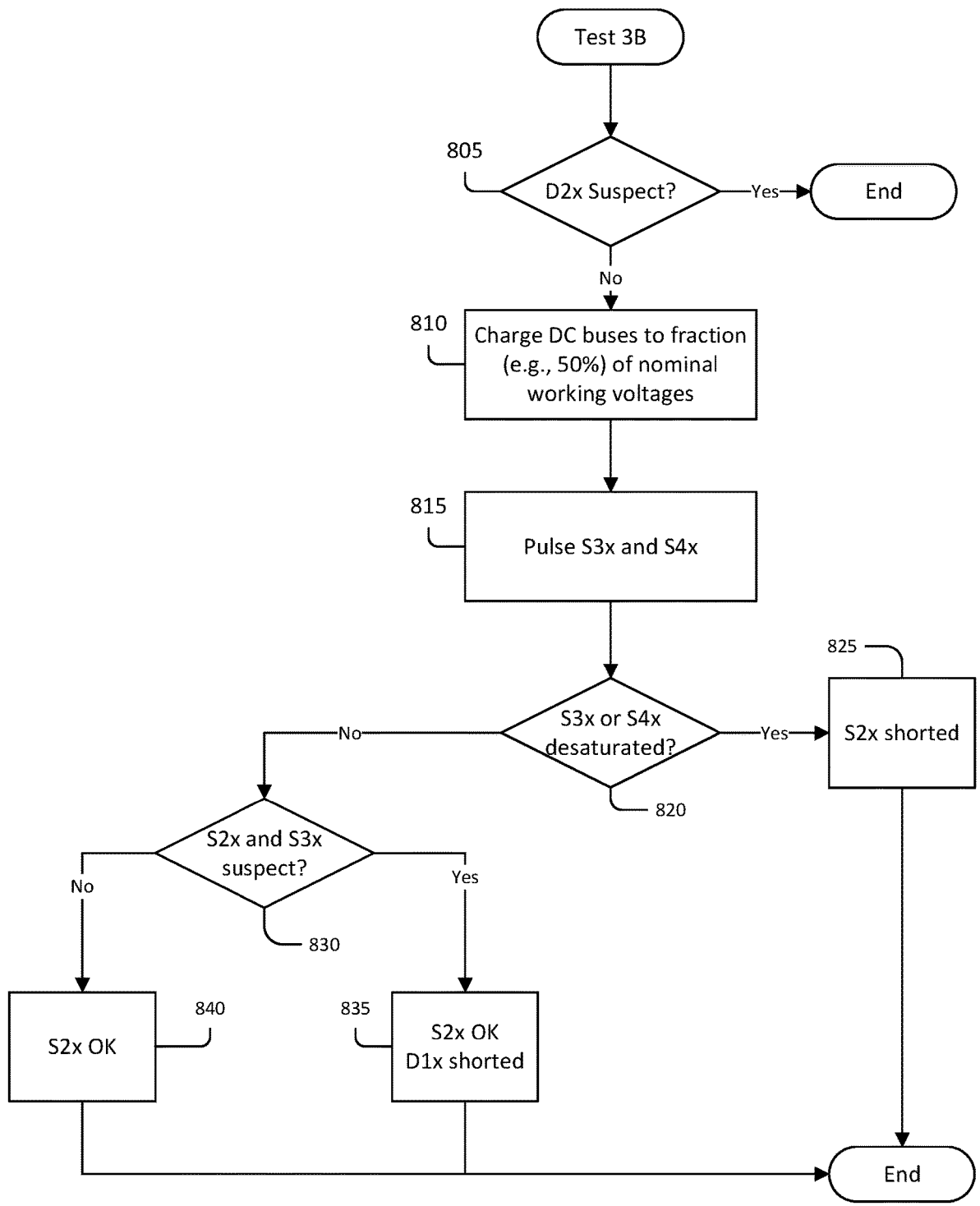

A shorting Test 3B is then performed as shown in FIG. 8. If the negative pole diode D2x has previously been identified as suspect, this test is not performed (block 805). If the negative pole diode D2x has not been previously identified as suspect, the DC buses are again charged to the predetermined magnitudes and the negative pole inner and outer transistors S3x, S4x are pulsed (blocks 810, 815). If either of the negative pole inner and outer transistors S3x, S4x desaturates, then the positive pole inner transistor S2x may be identified as shorted (blocks 820, 825). If neither of the negative pole inner and outer transistors S3x, S4x desaturates and both of the inner transistors S2x, S3x have been previously identified as suspect, then the positive pole inner transistor S2x may be identified as functional and the positive pole diode D1x identified as shorted (blocks 830, 835). If neither of the inner transistors S2x, S3x has been previously identified as suspect, then the positive pole inner transistor S2x may be identified as functional (blocks 830, 840). This test is performed for each of the phases 210a, 210b, 210c.

Figure 9:
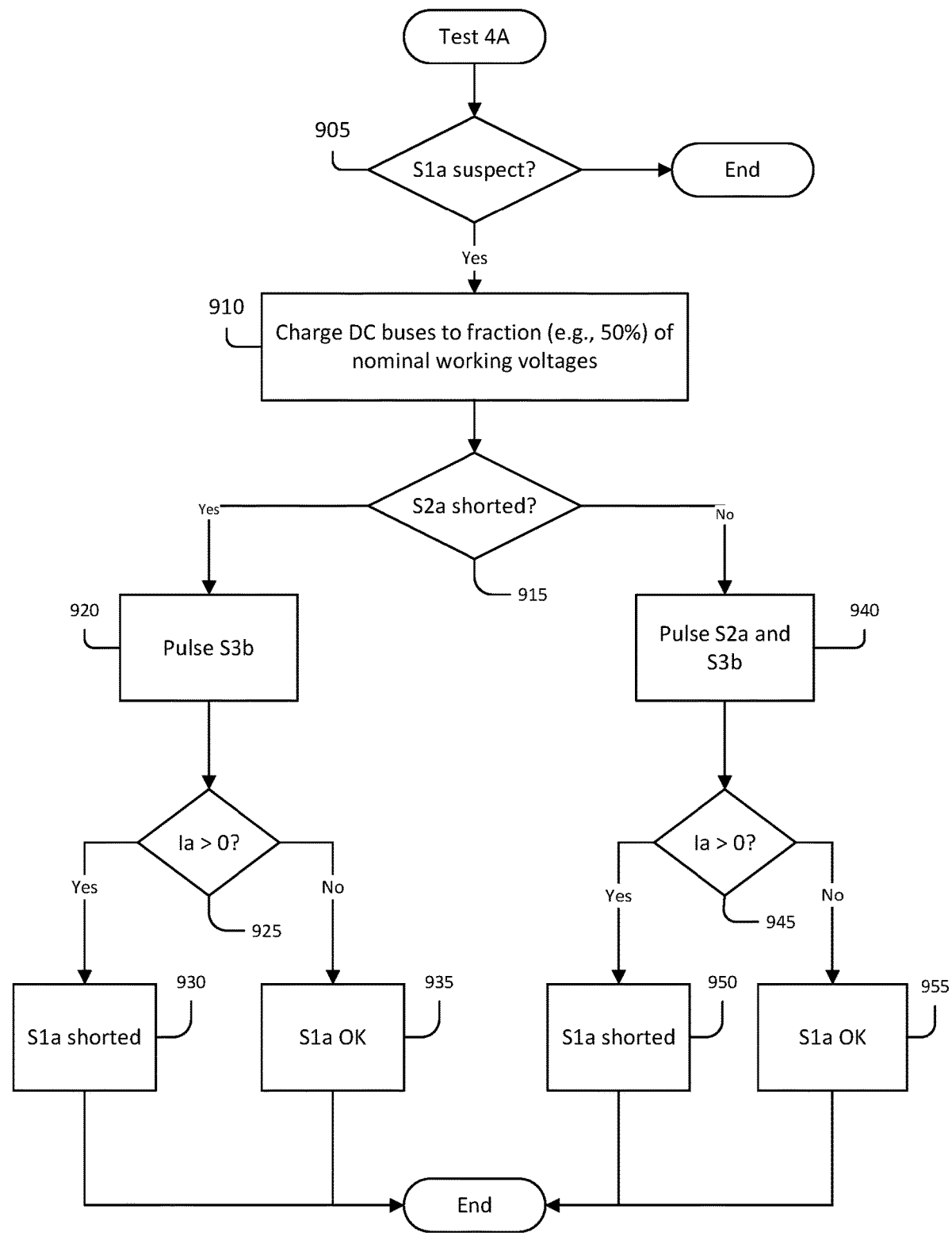

After the above-described desaturation-based tests are performed, a series of phase-phase conduction tests may be performed to determine the status of devices for which status has not been fully determined. In a conduction Test 4A is illustrated in FIG. 9, if an a-phase positive pole outer transistor S1a has been previously identified as suspect, this test is terminated (block 905). If not, the DC buses are charged to the predetermined magnitudes (block 910). If the corresponding a-phase positive pole inner transistor S2a has been previously identified as shorted, then the b-phase negative pole inner transistors S3b is pulsed (blocks 915, 920). This pulse may be considerably longer than the pulses used in the other tests in order to ensure sufficient time to establish a current between the a and b phases. For example, this pulse may be on the order of a few hundred microseconds (e.g., around 500 microseconds). If the a-phase current Ia is greater than zero in response to the pulse, then the a-phase positive pole outer transistor S1a may be identified as shorted (blocks 925, 930). If not, then the a-phase positive pole outer transistor S1a may be identified as functional (blocks 925, 935).

If the a-phase positive pole inner transistor S2a has not been previously identified as shorted, then the a-phase positive pole inner transistor S2a and the b-phase negative pole inner transistor S3b are pulsed (blocks 915, 940). If an a-phase current Ia greater than zero results, then the a-phase positive pole outer transistor S1a may be identified as shorted (blocks 945, 950). If not, then the a-phase positive pole outer transistors S1a may be identified as functional (blocks 945, 955). This test is performed for each pair of phases, i.e., 210a-210b, 210b-210c and 210c-210a.

Figure 10:
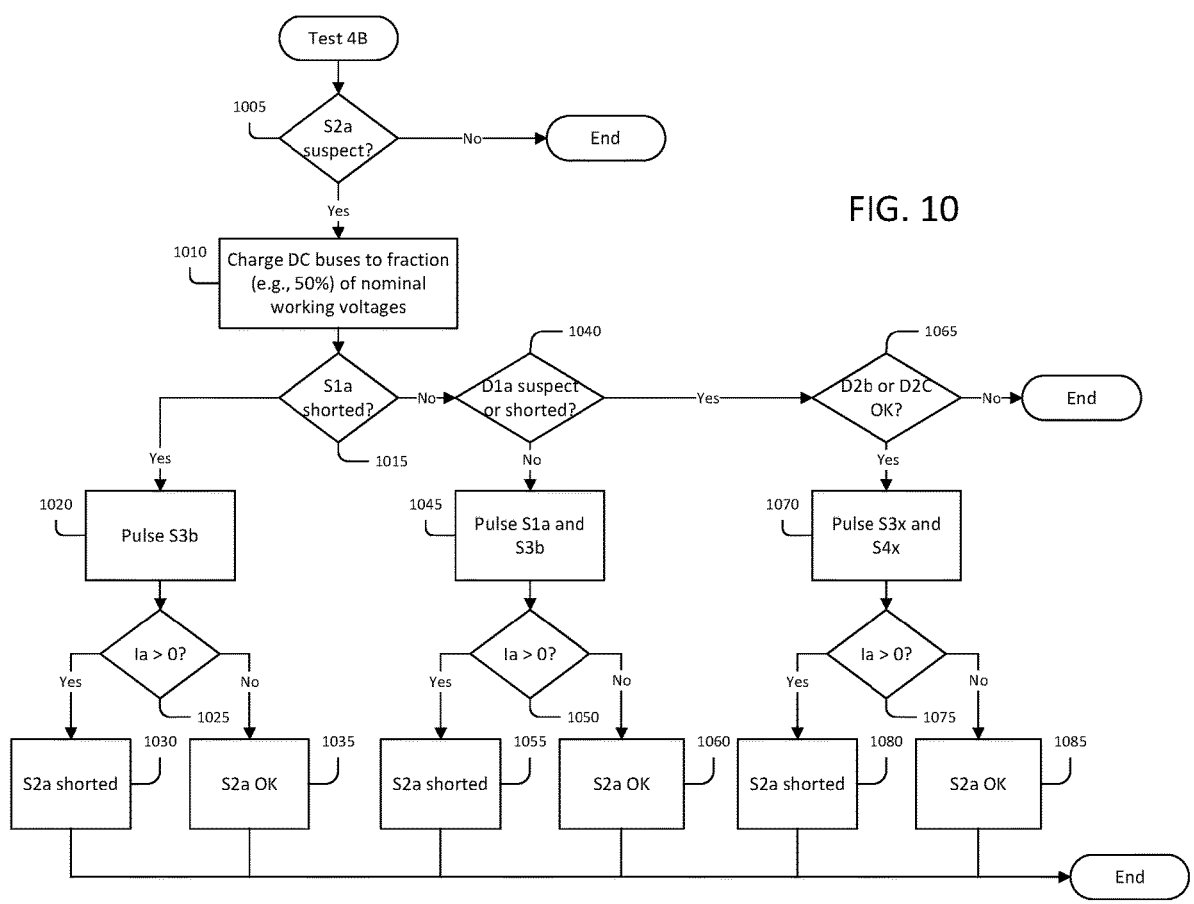

FIG. 10 illustrates another conduction Test 4B. If the a-phase positive pole inner transistor S2a has been previously identified as suspect, the test is not performed (block 1005). If the a-phase positive pole inner transistor S2a has not yet been identified as functional or suspect, the DC buses are charged to the predetermined magnitudes (block 1010). If the a-phase positive pole outer transistor S1a has previously been identified as shorted and the a-phase positive pole diode D1a has not been identified as suspect or shorted, the a-phase positive pole outer transistor S1a and the b-phase negative pole inner transistor S3b are pulsed (blocks 1015, 1040, 1045). If this produces a non-zero a-phase current Ia, the a-phase positive pole inner transistor S2a may be identified as shorted (blocks 1050, 1055). If the a-phase current Ia is zero, then the a-phase positive pole inner transistor S2a may be identified as functional (blocks 1050, 1050). If the a-phase positive pole outer transistor S1a has not been identified as shorted, the a-phase positive pole diode D1a has been identified as shorted or suspect, and the b-phase negative diode D2b or the c-phase negative pole diode D2c have already been identified as functional, the negative pole inner transistor S3x and negative pole outer transistor S4x of the phase corresponding to functional one of the b-phase negative pole diode D2b or c-phase negative pole diode D2c are pulsed (blocks 1015, 1040, 1065, 1070). If this produces a non-zero a-phase current Ia, then the a-phase positive pole inner transistor S2a may be identified as shorted (blocks 1075, 1080). If not, then the a-phase positive pole inner transistor S2a may be identified as functional (blocks 1075, 1085).

Returning to the left side of FIG. 10, if the a-phase positive pole outer transistor S1a has been previously identified as shorted, the b-phase negative pole inner transistor S3b is pulsed (blocks 1015, 1020). If this produces a non-zero a-phase current Ia, then the a-phase positive pole inner transistor S2a may be identified as shorted (blocks 1025, 1030). If no a-phase current Ia is produced, then the a-phase positive pole inner transistor S2a may be identified as functional (blocks 1025, 1035). This test may be repeated in a similar manner to determine whether the b-phase and c-phase positive pole inner transistors are shorted or functional if they have been previously identified as suspect.

Figure 11:
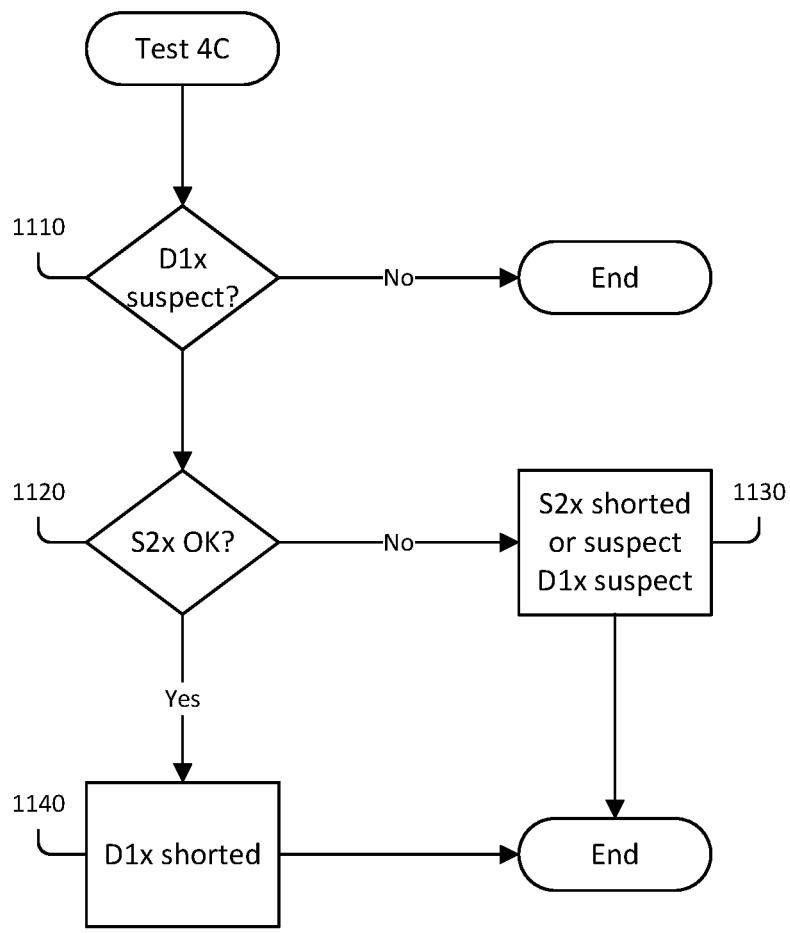

FIG. 11 illustrates operations that may be performed at this point to determine whether the positive pole diode for a particular phase is shorted if it has been previously identified as suspect. If the positive pole diode D1x has not been identified as suspect, no further operations are needed (block 1110). If the positive pole diode D1x has been identified as suspect and the corresponding positive pole inner transistor S2x has been identified as functional in the prior test of FIG. 10, the positive pole diode may be identified as shorted (blocks 1110, 1120, 1140). If the positive pole inner transistor S2x has not been identified as functional, then the positive pole inner transistor S2x is identified as shorted or suspect and the positive pole diode D1x is identified as suspect (blocks 1120, 1130).

Figure 12:
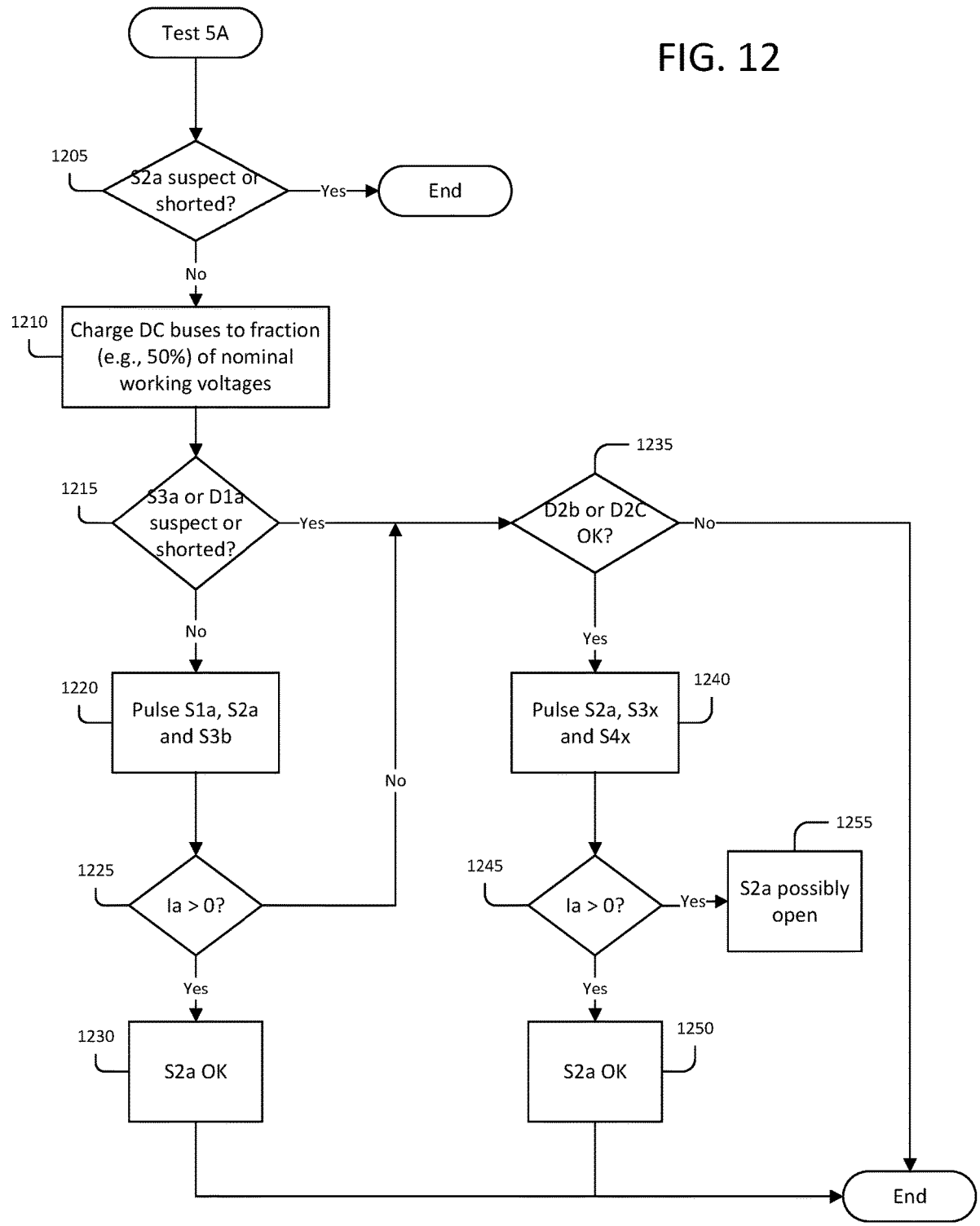

FIG. 12 illustrates a subsequent conduction Test 5A. If the a-phase positive pole inner transistor S2a has been identified as suspect or shorted, this test is not performed (block 1205). If not, the buses are charged to the predetermined magnitudes (blocks 1205, 1210). If the a-phase negative pole inner transistor S3a or the a-phase positive pole diode has not been identified as suspect or shorted, the a-phase positive pole outer transistor S1a, the a-phase positive pole inner transistor S2a, and the b-phase negative pole inner transistor S3b are pulsed (blocks 1215, 1220). If a non-zero a-phase current Ia is produced, the a-phase positive pole inner transistor S2a may be identified as functional (blocks 1225, 1230).

If no current is produced, an alternative current path is tried. If the b-phase negative pole diode D2b or the c-phase negative pole diode D2c have been previously identified as functional, the a-phase negative pole inner transistor S2a and the corresponding-phase negative pole inner transistor S3x and outer transistor S4x are pulsed (blocks 1225, 1235, 1240). If this produces a non-zero a-phase current Ia, the a-phase positive pole inner transistor S2a may be identified as functional (blocks 1245, 1250). If not, the a-phase positive pole inner transistor S2a may be identified as possibly open-circuited (blocks 1245, 1255).

Figure 13:
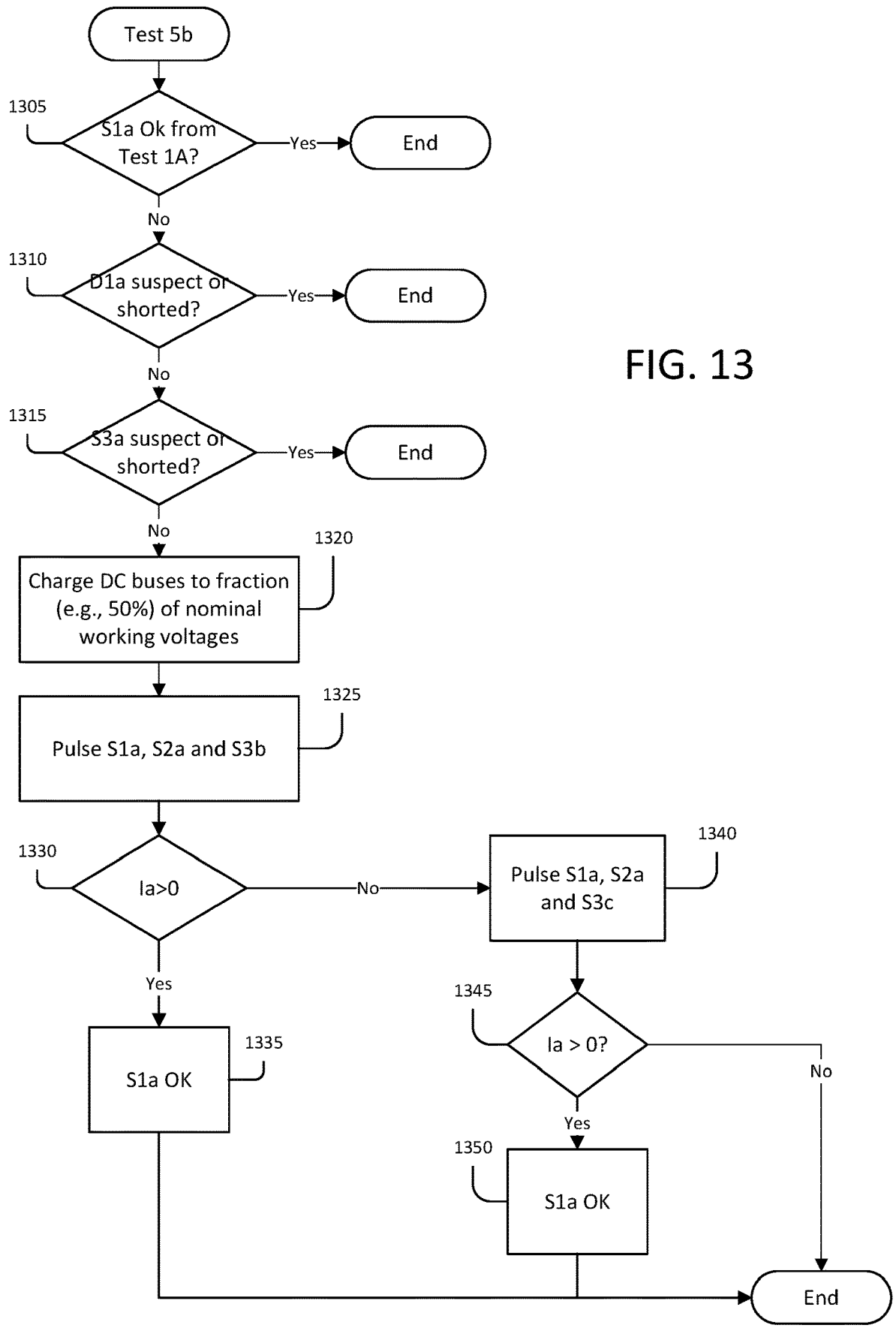

FIG. 13 illustrates another conduction Test 5b which is used to determine the state of the positive pole outer transistors S1a, S1b, S1c if they have not already been identified as functional in Test 1A. If the corresponding a-phase positive pole outer transistor S1a has been identified as functional, the a-phase positive pole diode D1a has been identified as suspect or shorted, or the a-phase negative pole inner transistor S3a has been identified as suspect or shorted, this test is not performed (blocks 1305, 1310, 1315). Otherwise, the DC buses are charged to the predetermined magnitudes (block 1320). The a-phase positive pole outer transistor S1a, the a-phase positive pole inner transistor S2a and the b-phase negative pole inner transistor are then pulsed (block 1325). If this produces a non-zero a-phase current Ia, then the a-phase positive pole outer transistor S1a may be identified as functional (blocks 1330, 1335). If not, the a-phase positive pole outer transistor S1a, the a-phase positive pole inner transistor S2a and the c-phase negative pole inner transistor S3c are pulsed (blocks 1330, 1340). If a non-zero a-phase current Ia is produced, then the a-phase positive pole outer transistor S1a may be identified as functional (blocks 1345, 1350). It will be understood that this test is repeated in a similar manner for the b- and c-phase positive pole outer transistors S1b, S1c.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of testing a multilevel inverter comprising a plurality of poles coupled to a DC bus, each pole having inner and outer switches and a neutral clamping diode coupled thereto, the method comprising:
   charging the DC bus to a predetermined voltage magnitude that is less than a nominal working voltage magnitude of the DC bus;
   selectively pulsing at least one of the inner and outer switches; and
   determining a status of at least one of the inner switches, the outer switch and the neutral clamping diodes based whether the pulsed at least one of the inner and outer switches desaturates.

2. The method of claim 1, wherein the predetermined voltage magnitude is around 50% or less of the nominal working voltage magnitude.

3. The method of claim 1:
   wherein the charging of the DC bus comprises:
      connecting the DC bus to a DC power source to charge the DC bus; and
      disconnecting the DC bus from the DC power source responsive to a magnitude of a voltage of the DC bus meeting or exceeding the predetermined voltage magnitude; and
   wherein the pulsing occurs after disconnecting the DC bus from the DC power source.

4. The method of claim 1, wherein the pulsing is for a duration sufficient to allow desaturation of the pulsed switch without exceeding ratings of the switches and diodes of the inverter.

5. The method of claim 1, further comprising:
   selectively pulsing at least one of the inner and outer switches; and
   responsively determining a status of at least one of the inner switches and the outer switches based whether a non-zero phase current for a load attached to the inverter occurs.

6. A method of testing a multilevel inverter comprising a plurality of poles coupled to a DC bus, each pole having inner and outer switches and a neutral clamping diode coupled thereto, the method comprising:
   by charging the DC bus to a predetermined voltage magnitude that is less than a nominal working voltage magnitude of the DC bus;
   selectively pulsing at least one the inner and outer switches; and
   determining a status of at least one of the inner switches and the outer switches based whether a non-zero phase current for a load attached to the inverter occurs in response to the pulsing.

7. The method of claim 6, wherein the predetermined voltage magnitude is around 50% or less of the nominal working voltage magnitude.

8. The method of claim 6:
wherein the charging of the DC bus comprises:
- connecting the DC bus to a DC power source to charge the DC bus; and
- disconnecting the DC bus from the DC power source responsive to a magnitude of a voltage of the DC bus meeting or exceeding the predetermined voltage magnitude; and wherein the pulsing occurs after disconnecting the DC bus from the DC power source.

9. A method of testing a multilevel inverter comprising a positive pole and a negative pole coupled to a DC bus, each of the positive and negative poles comprising an outer switch, an inner switch and a neutral clamping diode, the method comprising:
- charging the DC bus to a predetermined voltage magnitude that is less than a nominal working voltage magnitude of the DC bus;
- pulsing one of the outer switches; and
- determining a status of at least one of the inner switches and the neutral clamping diodes based on whether the one of the outer switches desaturates in response to the pulsing.

10. The method of claim 9, further comprising:
- pulsing the inner switches of the positive and negative poles; and
- determining a status of at least one of the positive pole inner switch, the negative pole outer switch and the positive pole outer switch based on whether either of the pulsed inner switches desaturates.

11. The method of claim 9, further comprising:
- pulsing the inner and outer switches of a first one of the positive and negative poles; and
- determining a status of at least one of the inner switch and the neutral clamping diode of a second one of the positive and negative poles based on whether either of the pulsed inner and outer switches desaturates.

12. The method of claim 11, further comprising:
- pulsing one of a combination of the positive pole inner switch for a first phase and the negative pole inner switch for a second phase or the negative pole inner switch for the second phase; and
- determining a status of the positive pole inner switch for the first phase based on whether the pulsing of the one of the combination of the positive pole inner switch for a first phase and the negative pole inner switch for a second phase or the negative pole inner switch for the second phase produces a current in the first phase.

13. The method of claim 12, wherein the inverter comprises at least two phases, each comprising positive and negative poles, the method further comprising:
- pulsing one of the negative pole inner switch of the second phase or a combination of a positive pole inner switch of a first phase and a negative pole inner switch of a second phase; and
- determining a status of a positive pole outer switch of the first phase based on whether the pulsing of the one of the negative pole inner switch of the second phase or a combination of a positive pole inner switch of a first phase and a negative pole inner switch of a second phase produces a current in the first phase.

14. The method of claim 13, further comprising:
- pulsing one of the negative pole inner switch of the second phase, a combination of the positive pole outer switch of the first phase and the negative pole inner switch of the second phase or a combination of the negative pole inner switch and the negative pole outer switch of the second phase or a third phase; and
- determining a status of the positive pole inner switch of the second phase based on whether the pulsing of the one of the negative pole inner switch of the second phase, a combination of the positive pole outer switch of the first phase and the negative pole inner switch of the second phase or a combination of the negative pole inner switch and the negative pole outer switch of the first phase or a third phase produces a current in the first phase.

15. The method of claim 14, further comprising:
- pulsing one of a combination of the positive pole outer switch of the first phase, the positive pole inner switch of the first phase and the negative pole inner switch of the second phase or a combination of the positive pole inner switch of the first phase and the negative pole inner and outer switches of the second phase or the third phase; and
- determining the status of the positive pole inner switch of the first phase based on whether the pulsing of the one of a combination of the positive pole outer switch of the first phase, the positive pole inner switch of the first phase and the negative pole inner switch of the second phase or a combination of the positive pole inner switch of the first phase and the negative pole inner and outer switches of the second phase or the third phase produces a non-zero current in the first phase.

16. The method of claim 14, further comprising:
- pulsing a combination of the positive pole outer switch for the first phase, the positive pole inner switch for the first phase and the negative pole inner switch for the second phase;
- determining a status of the positive pole outer switch of the first phase based on whether the pulsing of the combination of the positive pole outer switch for the first phase, the positive pole inner switch for the first phase and the negative pole inner switch for the second phase produces a current in the first phase; and
- if the pulsing of the combination of the positive pole outer switch for the first phase, the positive pole inner switch for the first phase and the negative pole inner switch for the second phase does not produce a current in the first phase:
  - pulsing a combination of the positive pole outer switch for the first phase, the positive pole inner switch for the first phase and the negative pole inner switch for the third phase; and
  - determining a status of the positive pole outer switch for the first phase based on whether the pulsing of the combination of the positive pole outer switch for the first phase, the positive pole inner switch for the first phase and the negative pole inner switch for the third phase produces a current in the first phase.

* * * * *